(12) United States Patent
Paver et al.

(10) Patent No.: US 12,372,551 B2
(45) Date of Patent: Jul. 29, 2025

(54) VOLTAGE PROBE DEVICE WITH ADJUSTABLE BIAS

(71) Applicant: Keysight Technologies, Inc., Santa Rosa, CA (US)

(72) Inventors: Hal Robert Paver, Colorado Springs, CO (US); Michael Thomas McTigue, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 209 days.

(21) Appl. No.: 17/972,297

(22) Filed: Oct. 24, 2022

(65) Prior Publication Data

US 2024/0133921 A1  Apr. 25, 2024
US 2024/0230718 A9  Jul. 11, 2024

(51) Int. Cl.
| | |
|---|---|
| *G01R 1/07* | (2006.01) |
| *G01R 15/22* | (2006.01) |
| *G01R 19/00* | (2006.01) |
| *G01R 19/252* | (2006.01) |
| *G01R 31/302* | (2006.01) |

(52) U.S. Cl.
CPC .............. *G01R 1/071* (2013.01); *G01R 15/22* (2013.01); *G01R 19/0084* (2013.01); *G01R 19/252* (2013.01); *G01R 31/3025* (2013.01)

(58) Field of Classification Search
None
See application file for complete search history.

(56) References Cited

U.S. PATENT DOCUMENTS

| | | |
|---|---|---|
| 6,603,891 B2 | 8/2003 | Schumann |
| 10,234,501 B2 | 3/2019 | Mende et al. |
| 10,684,311 B2 | 6/2020 | Mende et al. |
| 1,118,773 A1 | 11/2021 | Ziegler et al. |
| 11,187,730 B2 | 11/2021 | Ziegler et al. |
| 2006/0153256 A1* | 7/2006 | Sanchez ................. H01S 5/042 372/34 |

(Continued)

FOREIGN PATENT DOCUMENTS

CN          203502480 U      3/2014

OTHER PUBLICATIONS

English translation of CN203502480U, 7 pgs.

(Continued)

*Primary Examiner* — Nasima Monsur

(57) ABSTRACT

A system and method for compensating for thermal drift of a probe device includes monitoring a first temperature of a laser source in a sensor head that receives output electrical signals from a DUT and outputs corresponding optical signals; monitoring a second temperature of a photoreceiver in a probe interface that converts the optical signals to electrical test signals to input to the test instrument; calculating a first value of a first bias voltage; applying the first value of the first bias voltage to the laser source to compensate for thermal drift when the first temperature is within a first predefined temperature range; calculating a second value of a second bias voltage for the photoreceiver; and applying the second value of the second bias voltage to the photoreceiver to compensate for thermal drift when the second temperature is within a second predefined temperature range.

20 Claims, 7 Drawing Sheets

(56) References Cited

U.S. PATENT DOCUMENTS

| 2009/0080903 A1* | 3/2009 | Moriyasu | H04B 10/572 |
| | | | 372/34 |
| 2015/0171589 A1* | 6/2015 | Mende | G01R 1/071 |
| | | | 250/205 |
| 2021/0190830 A1* | 6/2021 | Scott | G02F 1/21 |

OTHER PUBLICATIONS

"IsoVu™ Optically Isolated DC-1 GHZ Measurement System Offers >120 dB CMRR with 2kV Common Mode Range", Tektronix, 2016, www.testoon.com, pp. 1-8.

\* cited by examiner

VOLTAGE PROBE DEVICE WITH ADJUSTABLE BIAS

BACKGROUND

Generally, oscilloscopes receive signals for performing measurements in the time domain through one or more probes. High attenuation probes, in particular, are used for measuring high voltages from devices under test (DUTs). Various conventional high attenuation probes are available from different manufacturers, including for example the N2790A 100 MHz High Voltage Differential Probe, available from Keysight Technologies, Inc.

However, high attenuation probes limit common mode signal rejection. That is, a conventional probe is galvanically connected to a test instrument, such as an oscilloscope, with an input connected to voltage input from the high attenuation probe and an input directly tied to the reference of the test instrument. The reference represents a large mass that is capacitively coupled to earth. When a common mode signal is common to both inputs, this mass will need to reach potential. As the common mode signal increases in frequency, the large capacitance of the probe and oscilloscope solution cannot match the frequency and the common mode signal is converted to differential signal, inaccurately appearing to be part of the measurement.

Conventional high attenuation probes may isolate the test instrument from portions of the probe by converting electrical signals from the DUT to optical signals in the signal path to the test instrument. However, such probes are particularly sensitive to changes in temperature, which affect functionality of optical sources and corresponding photoreceivers within the probe. Such temperature changes may require frequent and time-consuming calibrations of the probe in order to preserve measurement accuracy.

SUMMARY

According to a representative embodiment, a probe device is provided for performing voltage measurements by a test instrument of a device under test (DUT). The probe device includes an optical cable including multiple fibers, a sensor head connectable to the optical cable, and a probe interface connectable to the test instrument. The sensor head includes a laser source configured to receive output electrical signals from the DUT, the output electrical signals driving the laser source to provide optical signals corresponding to the output electrical signals from the DUT; a first temperature sensor configured to monitor a first temperature of the laser source; a first voltage source configured to provide a first bias voltage for the laser source; and a first processing unit configured to calculate a first value of the first bias voltage using the first temperature from the first temperature sensor, and to control the first voltage source to compensate for thermal drift of the laser source within a first predefined temperature range. The probe interface includes a photoreceiver configured to receive the optical signals over the optical cable, to convert the optical signals to electrical test signals and to input the electrical test signals to the test instrument; a second temperature sensor configured to monitor a second temperature of the photoreceiver; a second voltage source configured to provide a second bias voltage to the photoreceiver; and a second processing unit configured to calculate a second value of the second bias voltage using the second temperature from the second temperature sensor, and to control the second voltage source to compensate for thermal drift of the photoreceiver within a second predefined temperature range.

According to another representative embodiment, a method is provided for compensating for thermal drift of a probe device performing high voltage measurements of a DUT, where the probe device includes a probe interface connected to a test instrument, a sensor head connected to the probe interface via an optical cable, and a probe tip connected to the sensor head. The method includes monitoring a first temperature of a laser source in the sensor head, where the laser source is configured to receive output electrical signals from the DUT via the probe tip, where the output electrical signals drive the laser source to provide optical signals corresponding to the output electrical signals from the DUT; monitoring a second temperature of a photoreceiver in the probe interface, where the photoreceiver is configured to convert the optical signals received from the laser source in the sensor head via the optical cable to electrical test signals to input to the test instrument; calculating a first value of a first bias voltage for the laser source using the first temperature from the first temperature sensor; applying the first value of the first bias voltage to the laser source using a first bias source to compensate for thermal drift of the laser source when the first temperature is within a first predefined temperature range; calculating a second value of a second bias voltage for the photoreceiver using the second temperature from the second temperature sensor; and applying the second value of the second bias voltage to the photoreceiver to using a second bias source to compensate for thermal drift of the photoreceiver when the second temperature is within a second predefined temperature range.

According to another representative embodiment, a system is provided for performing voltage measurements by a test instrument of a DUT, where the system includes a probe device connectable to the test instrument, a first processing unit, and a second processing unit. The probe device includes an optical cable including multiple fibers and a sensor head connectable to the optical cable, where the sensor head includes a laser source configured to receive output electrical signals from the DUT, the output electrical signals driving the laser source to provide optical signals corresponding to the output electrical signals from the DUT; a first temperature sensor configured to monitor a first temperature of the laser source; and a first voltage source configured to provide a first bias voltage for the laser source. The probe device further includes a probe interface connectable to the test instrument, where the probe interface includes a photoreceiver configured to receive the optical signals over the optical cable, to convert the optical signals to electrical test signals and to input the electrical test signals to the test instrument; a second temperature sensor configured to monitor a second temperature of the photoreceiver; and a second voltage source configured to provide a second bias voltage to the photoreceiver. The first processing unit is configured to calculate a first value of the first bias voltage using the first temperature from the first temperature sensor, and to control the first voltage source to compensate for thermal drift of the laser source within a first predefined temperature range. The second processing unit is configured to calculate a second value of the second bias voltage using the second temperature from the second temperature sensor, and to control the second voltage source to compensate for thermal drift of the photoreceiver within a second predefined temperature range.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
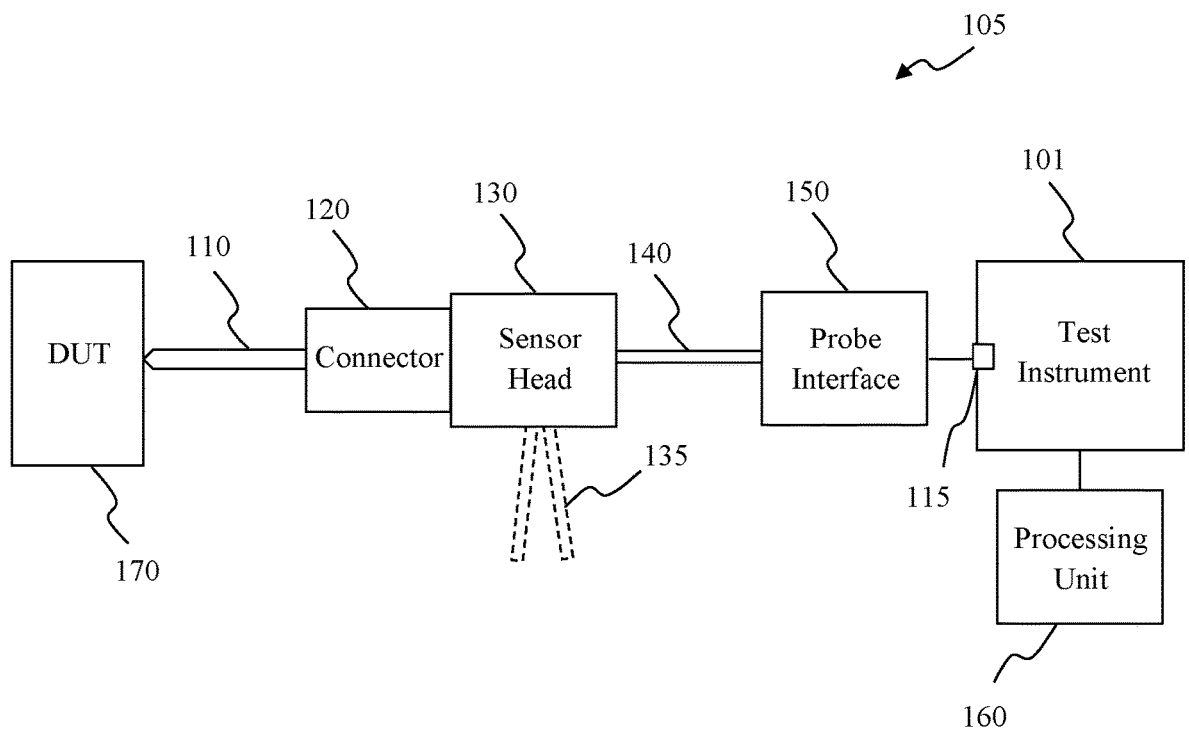
FIG. 1 is a simplified block diagram showing a probe system including a high voltage probe device for measuring high voltage signals from a device under test (DUT), according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to various embodiments, a probe device allows for high common mode rejection of high voltage signals originating from a DUT, providing increased safety for users and test equipment from high voltages. In addition, the high voltage measurement system enables probed measurements to be made of the voltage signals over a greater distance between the test instrument and the DUT. Temperature changes within the probe device are compensator for automatically by changing bias voltages of optical sources and/or photoreceivers in the probe device whenever temperature changes fall within predefined temperature ranges. Temperature changes outside of the predefined temperature ranges trigger recalibration of the probe device using internally available calibration voltage source.

Figure 2A:
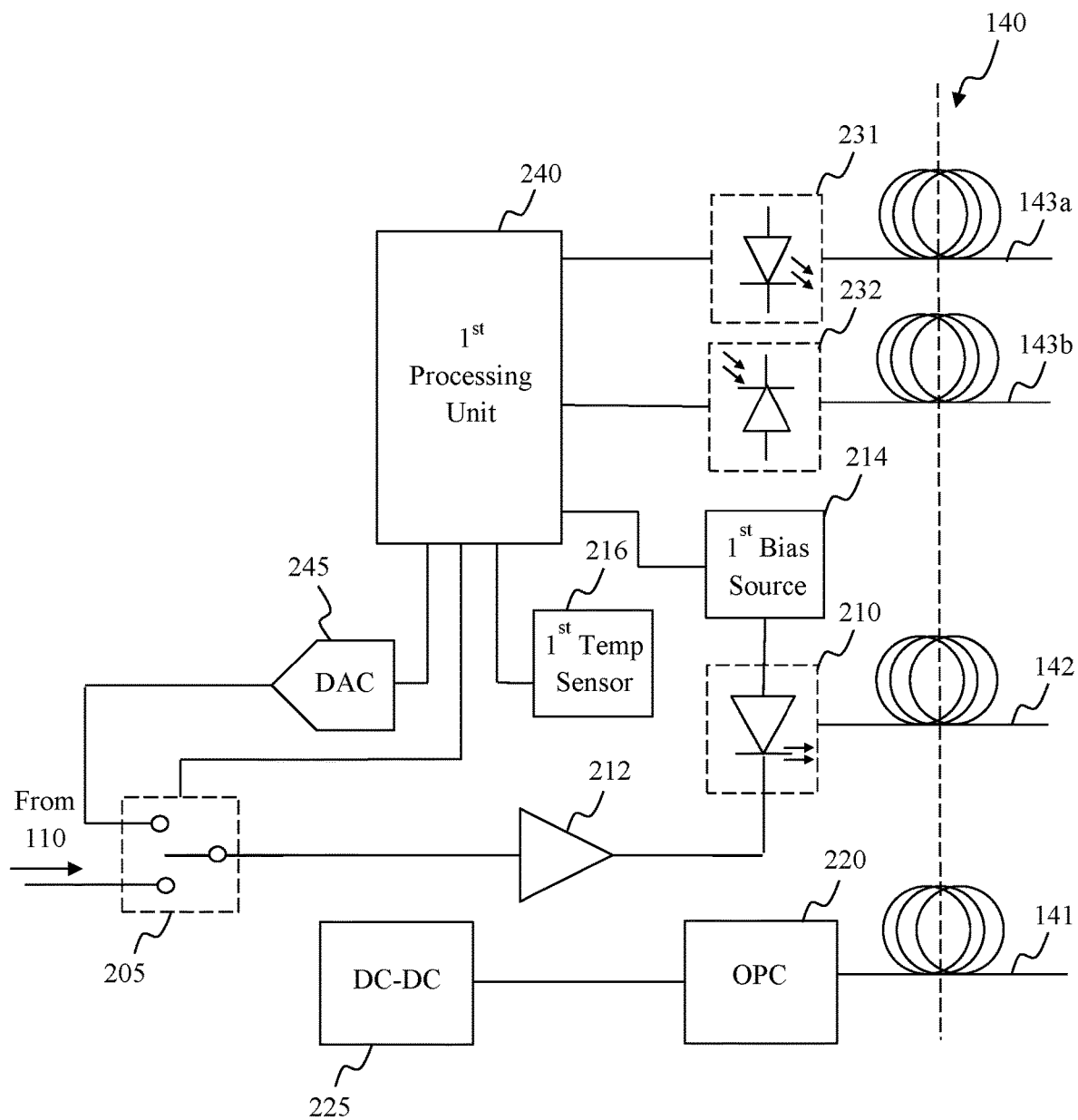
FIG. 2A is a simplified circuit diagram of a sensor head of the high voltage probe device connectable to a test instrument, according to a representative embodiment.
Figure 2B:
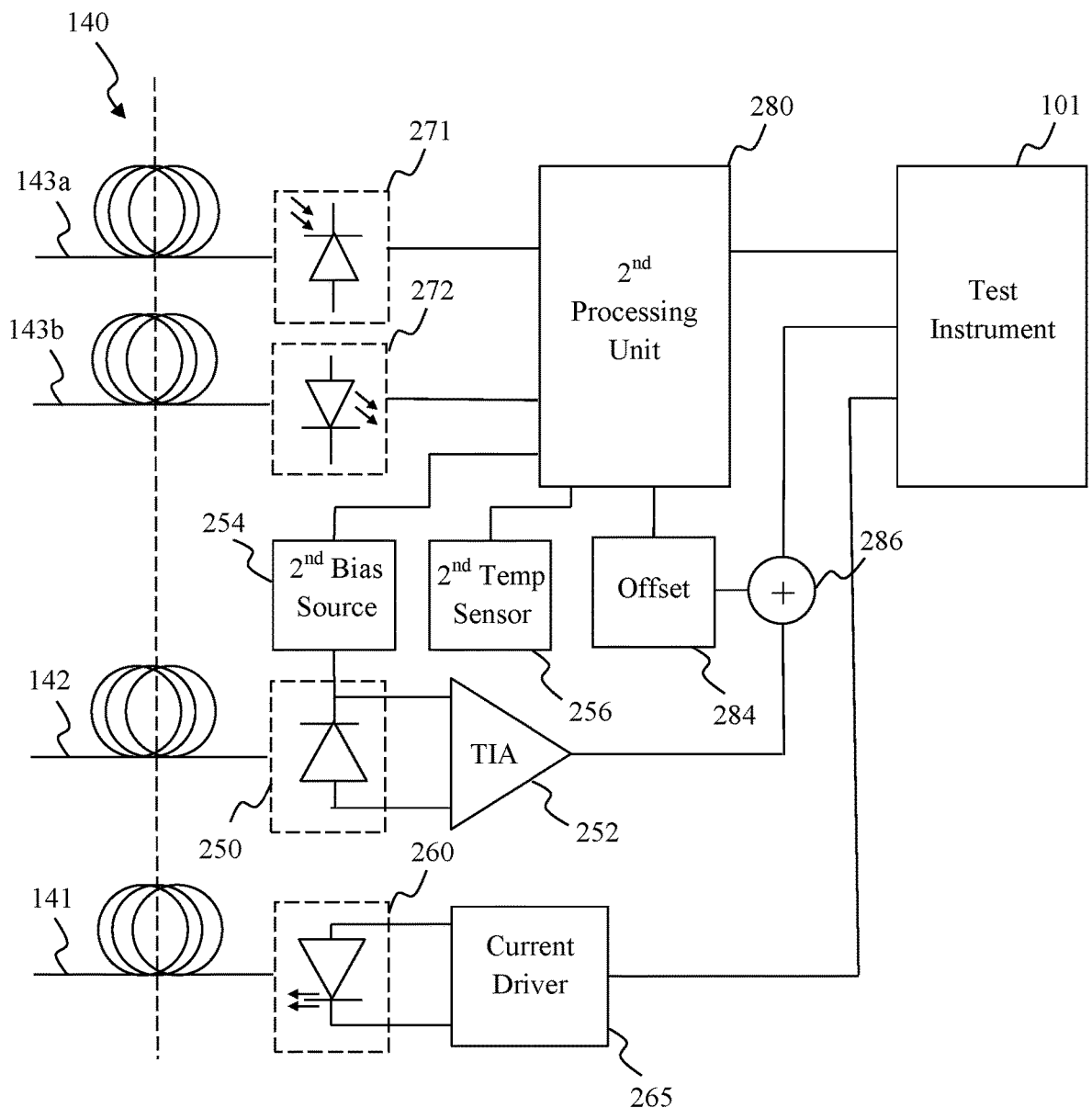
FIG. 2B is a simplified circuit diagram of a probe interface of the high voltage probe device connectable to a probe tip, according to a representative embodiment.

FIG. 1 is a simplified block diagram showing a probe system including a high voltage probe device for measuring high voltage signals from a device under test (DUT), according to a representative embodiment. FIG. 2A is a simplified block diagram of a sensor head of the high voltage probe device connectable to a probe tip, according to representative embodiment, and FIG. 2B is a simplified block diagram of a probe interface of the high voltage probe device connectable to a test instrument, according to representative embodiment.

Referring to FIG. 1, probe system 100 enables high common mode rejection and reliable high voltage measurements of a DUT 170 by test instrument 101, while automatically compensating for temperature changes. The test instrument 101 may be any instrument capable of making voltage measurements, such as an oscilloscope, a vector network analyzer (VNA) or a spectrum analyzer, for example. The probe system 100 includes a probe device 105 for communicating test signals from the DUT 170 to the test instrument 101, and a processing unit 160 for controlling operations of the probe device 105 and measurements by the test instrument 101. Generally, the probe device 105 translates the high voltage signals from the DUT 170 to low voltage signals measurable by the test instrument 101. The processing unit 160, which is discussed below in more detail with reference to FIG. 3, may be included in the test instrument 101 or otherwise in communication with the test instrument 101. For example, the test instrument 101 may be wired or wirelessly connected to an external personal computer (PC), laptop, or workstation, which includes the processing unit 160.

The probe device 105 is an optically isolated probe having a high common mode rejection ratio (CMRR), and is able to provide greater bandwidth than conventional, non-optically isolated probes. In the depicted embodiment, the probe device 105 includes a probe tip 110 for interfacing with the DUT 170, a connector 120, a sensor head 130, an optical cable 140, and a probe interface 150 for interfacing with the test instrument 101. Generally, the optical cable 140 is configured to communicate optical power signals (optical energy) from the probe interface 150 over the optical cable 140 to the sensor head 130 for powering the sensor head 130, optical test signals from the sensor head 130 to the probe interface 150 for providing measurements from the DUT 170 to the test instrument 101, and low speed information between the probe interface 150 and the sensor head 130 for controlling operations of the probe device 105.

The probe tip 110 may include various different types of DUT connections for connecting with the DUT 170. For example, the probe tip 110 may include an MMCX connector, 0.100" pitch spaced square pin connector, or a 0.200" pitch spaced square pin connector, for interfacing with the DUT 170. It is understood that any type of DUT connection capable of communicating high voltage signals from the DUT 170 may be incorporated without departing from the scope of the present teachings.

The connector 120 is integrated with the sensor head 130 or the probe tip 110, and is configured to removably connect the probe tip 110 with the sensor head 130. The probe tip 110 is therefore interchangeable, and may be implemented using various types of probe tips. The types of probe tips provide different amounts of attenuation to enable measurement of different voltage ranges of electrical signals output by the DUT 170. The connector 120 may include a radio frequency (RF) connector and a memory interface for mating the probe tip 110 and the sensor head 130. The RF connector may be any compatible physical connector, such as a subminiature version A (SMA) connector, a bayonet Neill-Concelman (BNC) connector, or a threaded Neill-Concelman (TNC) connector, for example. The memory interface may be any compatible interface with a non-volatile memory, such as an electrically programmable read-only memory (EPROM) interface, an electrically erasable and programmable read only memory (EEPROM) interface, a universal serial bus (USB) interface, flash memory, and/or resistors, for example. The memory interface provides information to the sensor head 130 and/or the test instrument regarding the probe tip 110, such as the gain of the probe tip 110 and how to internally configure impedance to match that of the probe tip 110, for example.

The sensor head 130 is configured to receive the output electrical signals from the DUT 170 via the probe tip 110 and the connector 120, and to convert the output electrical signals to corresponding optical signals, as discussed below. In an embodiment, the sensor head 130 is further configured to convert optical power signals received over the optical cable 140 from the probe interface 150 to electrical power signals, which powers the sensor head 130, the connector 120, and the probe tip 110. The probe device 105 may optionally include a support 135, such as a bipod, for example, for securing the sensor head 130 to prevent unintentional grounding or shorting of high voltage signals.

FIG. 2A is a simplified block diagram of the sensor head 130, in more detail, according to representative embodiment. Referring to FIG. 2A, the sensor head 130 includes an optical signal source 210, an optical power converter (OPC) 220, a first light emitting diode (LED) 231, and a second sensor diode 232, all of which are connected to the optical cable 140 for respectively transmitting or receiving optical signals over the optical cable 140. The optical cable 140 may be an optical fiber bundle, for example, and may include any type of compatible optical media, such as coaxial cables, waveguides, striplines, and/or microstrips, for example, without departing from the scope of the present teachings. The sensor head 130 further includes a first processing unit 240 configured to control operations of the sensor head 130, as discussed below. The first processing unit 240 may be any type of control circuitry capable of performing the functions described herein, without departing from the scope of the present teachings. For example, the first processing unit 240 may be a microcontroller, such as an Intel MCS-51 microcontroller, available from Intel Corporation. Alternatively, the first processing unit 240 may be a field-programmable gate array (FPGA) with a processor core (system on chip (SoC)), such as a Xilinx Z-7010, available from Xilinx, for example. The first processing unit 240 may include all or part of the components of processing unit 300 described below with reference to FIG. 3, including processors and non-transitory memories storing instructions for performing the respective functions herein. Also, although shown and described in the sensor head 130, it is understood that in various embodiments all or part of the first processing unit 240 and/or the functionality of the first processing unit 240 may be provided by the test instrument 101 and/or the processing unit 160.

The optical signal source 210 may be a laser source, such as a laser diode, for example, and is configured to receive the output electrical signals from the DUT 170 via the probe tip 110, the connector 120 and a current amplifier 212, and to output corresponding optical signals in response. More particularly, the output electrical signals are received at the sensor head 130 via a switch 205, which may be integrated within the sensor head 130 or may be a separate component connected to the sensor head 130. The switch 205 is operable, e.g., manually or by the first processing unit 240, to select either the output electrical signals from the DUT 170 via the probe tip 110 or a calibration voltage signal from an internal calibration voltage source 245, such as a digital to analog converter (DAC), for example, discussed below. The output electrical signals are input to the current amplifier 212, which drives (directly modulates) the optical signal source 210 to provide the optical signals corresponding to the output electrical signals. In an embodiment, the optical signal source 210 may include an optical sensor and a transimpedance amplifier (TIA) (not shown) that provides feedback to the first processing unit 240, which may automatically adjust gain of the current amplifier 212 to match tip gain of the probe tip 110.

The sensor head 130 further includes a first bias source 214 configured to generate a first bias voltage for biasing the optical signal source 210, and a first temperature sensor 216 configured to monitor the temperature (first temperature) of the optical signal source 210 during operation of the probe device 105. The first bias source 214 is controlled by the first processing unit 240 to adjust the first bias voltage in order to compensate for fluctuations in the environment, including changes in the first temperature. That is, the first processing unit 240 receives temperature measurements of the first temperature from the first temperature sensor 216, and calculates a value (first value) of the first bias voltage using the first temperature. The first value of the first bias voltage may be calculated by applying a curve fit polynomial (first curve fit polynomial) to the first temperature, for example. The first curve fit polynomial defines a first temperature drift profile of the optical signal source 210 over a first predefined temperature range, as would be apparent to one skilled in the art. Generally, the polynomial will be dependent on the specific optical signal source (e.g., manufacturer and model), as well as environment factors, such as mounting style, enclosure, heat sources, and distance of first temperature sensor 216 to the optical signal source 210, for example. Of course, the first value of the first bias voltage may be determined by various alternative techniques, such as using a look-up table, applying a linear fit model, or performing an analog bias adjustment with the first temperature sensor 216 in a feedback loop, for example.

The first predefined temperature range is a set of temperatures ranging between upper and lower threshold values over which the optical signal source 210 is able to reliably convert the output electrical signals to corresponding optical signals based on the current calibration of the optical signal source 210. The first predefined temperature range is based on the acceptable tolerance of the entire system, which may be determined empirically, for example. This may include determining an acceptable error limit, and then controlling temperature corrections to meet the error limit. The first processing unit 240 provides the first value of the first bias voltage to the first bias source 214, which adjusts the first bias voltage to the first value, accordingly.

Monitoring of the first temperature by the first temperature sensor 216 and making corresponding adjustments to the first bias voltage by the first bias source 214 may be performed continuously or periodically over the course of testing the DUT 170. The adjusted first bias voltage is input to the optical signal source 210 to compensate for thermal drift of the optical signal source 210. The first bias source 214 may be a linear regulator, for example. The first temperature sensor 216 may be a thermocouple, a thermistor, a resistance temperature detector (RTD), or a semiconductor-based integrated circuit (IC), for example.

The first processing unit 240 adjusts the first bias voltage when the first temperature is within the first predefined temperature range. When temperature changes, including changes in ambient and probe self-heating temperatures, for example, cause the first temperature to fall outside the first predefined temperature range, as determined by the first processing unit 240, calibration (recalibration) of the sensor head 130 needs to be performed. In this case, the first processing unit 240 provides notice to the test instrument 101 of the need for recalibration. The notice may be provided, for example, using first electrical low frequency information provided to the first LED 231 for transmission to the probe interface 150 and ultimately to the test instrument 101, discussed below. In response, the test instrument 101 may automatically initiate a calibration procedure, either immediately or after the current measurements are completed. Alternatively, the test instrument 101 may notify a user through a user interface that recalibration of the sensor head 130 is needed. The user may then initiate the calibration, through the test instrument 101 and/or manually, at a time acceptable to the user. Generally, the calibration procedure for the sensor head 130 includes operating the switch 205 to select the calibration voltage signal from the internal calibration voltage source 245 and driving the optical signal source 210 using the calibration voltage signal. The calibration procedure for the sensor head 130 is addressed in detail below.

The OPC 220 of the sensor head 130 is configured to convert the optical power signals (optical energy) received from the probe interface 150 via the optical cable 140 to electrical power signals (electrical energy). The OPC 220 may be a photovoltaic circuit, for example. The electrical power signals are input to a DC-DC converter 225, which is configured to downconvert a higher DC voltage output by the OPC 220 to a lower DC voltage used for powering the sensor head 130 and the probe tip 110, and to provide matching. The DC-DC converter 225 may be a maximum power point tracker (MPPT), for example.

The first LED 231 is configured to convert first electrical low frequency information to first optical information, and to transmit the first optical information over the optical cable 140 to the probe interface 150. The first electrical control information may be gathered by the first processing unit 240, and may include the first temperature monitored by the first temperature sensor 216, feedback from the optical signal source 210, and information about the probe tip 110, for example, as well as notification that recalibration of the sensor head 130 needs to be performed, as mentioned above. The second sensor diode 232 is configured to receive the second optical information over the optical cable 140 from the probe interface 150, and to convert the second optical information into second electrical low frequency information. The second electrical low frequency information is input to the first processing unit 240 to be used to control operations of the sensor head 130 and/or the probe tip 110. For example, the second electrical low frequency information may include AC/DC coupling, calibration settings and commands, and bias settings, for example.

Referring again to FIG. 1, the sensor head 130 is connected to the probe interface 150 through the optical cable 140. The probe interface 150 is removably attached to one or more channels 115 of the test instrument 101, and is generally configured to convert electrical energy output from the test instrument 101 to optical energy, and to convert optical signals received over the optical cable 140 from the sensor head 130 to electrical test signals to input to the test instrument 101, where the electrical test signals correspond to output electrical signals output by the DUT 170.

FIG. 2B is a simplified block diagram of the probe interface 150 in more detail, according to representative embodiment. Referring to FIG. 2B, the probe interface 150 includes a photoreceiver 250, an optical power source 260, a first sensor diode 271, and a second LED 272, all of which are connected to the optical cable 140 for respectively receiving or transmitting optical signals over the optical cable 140. The probe interface 150 further includes a second processing unit 280 configured to control operations of the probe interface 150, as discussed below. As discussed above with regard to the first processing unit 240, the second processing unit 280 may be any type of control circuitry capable of performing the functions described herein, without departing from the scope of the present teachings. For example, the second processing unit 280 may be a microcontroller, such as an Intel MCS-51 microcontroller, or a field-programmable gate array (FPGA) with a processor core, such as a Xilinx Z-7010, for example. The second processing unit 280 may include all or part of the processing unit 300 described below with reference to FIG. 3, including processors and non-transitory memories storing instructions for performing the respective functions herein. Also, although shown and described in the probe interface 150, it is understood that in various embodiments all or part of the second processing unit 280 and/or the functionality of the second processing unit 280 may be provided by the test instrument 101 and/or the processing unit 160.

The photoreceiver 250 may be a photodiode or a phototransistor, for example. The photoreceiver 250 is configured to receive the optical signals from the optical signal source 210 of the sensor head 130 via the optical cable 140, and to output corresponding electrical test signals in response. A transimpedance amplifier (TIA) 252 is configured to convert the electrical test signals from electrical currents to corresponding voltages, and to amplify these voltage electrical test signals to be input to the test instrument 101 via the one or more channels 115. The electrical test signals comprise analog signals that are the substantially same as or correspond to the output electrical signals from the DUT 170. The electrical test signals are processed by the processing unit 160 in order to measure the output electrical signals from the DUT 170 and to display the corresponding measurement data, for example.

The probe interface 150 further includes offset 284 and combiner 286 (e.g., adder). The offset 284 is configured to generate an offset voltage, which is applied to the output of the TIA 252 by the combiner 286. The offset voltage adjusts offset of the test instrument 101 in order to prevent saturating later amplifiers in the signal chain.

In addition, the probe interface 150 includes a second bias source 254 configured to generate a second bias voltage for biasing the optical signal source 210, and a first temperature sensor 216 configured to monitor the temperature (second temperature) of the photoreceiver 250 during operation of the probe device 105. The second bias source 254 is controlled by the second processing unit 280 to adjust the second bias voltage to compensate for fluctuations in the environment, including changes in the second temperature. That is, the second processing unit 280 receives temperature measurements of the second temperature from the second temperature sensor 256, and calculates a value (second value) of the second bias voltage using the second temperature. As in the case of the first value of the first bias voltage, the second value of the second bias voltage may be calculated by applying a curve fit polynomial (second curve fit polynomial) to the second temperature, for example. The second curve fit polynomial defines a second temperature drift profile of the photoreceiver 250 over a second predefined temperature range, as would be apparent to one skilled in the art. The second value of the second bias voltage may be determined by various alternative techniques, such as using a look-up table, applying a linear fit model, or performing an analog bias adjustment with the second temperature sensor 256 in a feedback loop, for example.

The second predefined temperature range is a set of temperatures ranging between upper and lower threshold values over which the photoreceiver 250 is able to reliably convert the optical signals to corresponding electrical test signals based on the current calibration of the photoreceiver 250. The second predefined temperature range is based on the acceptable tolerance of the entire system, which may be determined empirically, for example, as discussed above. The second processing unit 280 provides the second value of the second bias voltage to the second bias source 254, which adjusts the second bias voltage to the second bias voltage, accordingly.

Monitoring of the second temperature by the second temperature sensor 256 and making corresponding adjustments to the second bias voltage by the second bias source 254 may be performed continuously or periodically over the course of testing the DUT 170. The adjusted second bias voltage is input to the photoreceiver 250 to compensate for its thermal drift. The second bias source 254 may be a linear regulator, for example. The second temperature sensor 256 may be a thermocouple, a thermistor, an RTD, or a semiconductor-based IC, for example.

Similar to the first processing unit 240, the second processing unit 280 adjusts the second bias voltage when the second temperature is within the second predefined temperature range. When temperature changes cause the second temperature to fall outside the second predefined temperature range, as determined by the second processing unit 280, calibration (recalibration) of the probe interface 150 needs to be performed. In this case, the second processing unit 280 provides notice to the test instrument 101 of the need for recalibration. The notice may be provided, for example, using second electrical low frequency information provided, which may also be provided to the second LED 272 for transmission to the sensor head 130. In response, the test instrument 101 may automatically initiate a calibration procedure, either immediately or after the current measurements are completed. Alternatively, the test instrument 101 may notify the user through the user interface that recalibration of the probe interface 150 is needed. The user may then initiate the recalibration, through the test instrument 101 and/or manually, at a time acceptable to the user. Generally, the calibration procedure for the probe interface 150 includes operating the switch 205 to select the calibration voltage signal from the internal calibration voltage source 245, and driving the optical signal source 210 using the calibration voltage signal to provide an optical calibration signal, which is transmitted to the photoreceiver 250 for performing the recalibration. The calibration procedure for the probe interface 150 is addressed in detail below.

The optical power source 260 may be a power laser, such as a distributed feedback (DFB) laser, for example, and is configured to convert electrical power signals (electrical energy) to corresponding optical power signals (optical energy), e.g., under control of the processing unit 160. In particular, the electrical power signals are provided by the test instrument 101 to a current driver 265, which drives (directly modulates) the optical power source 260 to provide the corresponding optical power signals. The current driver 265 may include a current amplifier, for example.

The first sensor diode 271 is configured to receive the first optical information over the optical cable 140 from the first LED 231 in the sensor head 130, and to convert the first optical information into first electrical low frequency information. The first electrical low frequency information may be provided to the second processing unit 280, which may provide it to the test instrument 101, such that the processing unit 160 may monitor various aspects of the probe device 105, including temperature response and/or adjust various control parameters, for example. The second LED 272 is configured to convert second electrical low frequency information to second optical information, and to transmit the second optical information over the optical cable 140 to the second sensor diode 232 of the sensor head 130. The second electrical low frequency information may be provided to the second LED 272 from the second processing unit 180, and may include control signals from the test instrument, for example, including control signals for executing recalibration, when needed. In an example, the probe interface 150 may include an AutoProbe I interface, available from Keysight Technologies, Inc., which provides intelligent communication (e.g., test and control signals) and power between the test instrument 101 and the sensor head 130 via the optical cable 140.

As mentioned above, the optical cable 140 may be an optical fiber bundle and may include any type of compatible optical media, such as glass and plastic fibers, for example. In an embodiment, the optical cable 140 combines both plastic and glass optical fibers for communicating optical test signals, optical power signals, and optical information between the sensor head 130 and the probe interface 150. For example, the optical cable 140 may include at least one multimode fiber 141 for transmitting the optical power signals from the optical power source 260 to the OPC 220, and at least one single mode fiber 142 for transmitting the optical signals from the optical signal source 210 to the photoreceiver 250. In addition, the optical cable 140 may include one or more plastic optical fibers, such as plastic optical fibers 143a and 143b, for transmitting the first optical information from the first LED 231 to the first sensor diode 271 and transmitting the second optical information from the second LED 272 to the second sensor diode 232, respectively. Alternatively, the first and second optical information may be transmitted over a single plastic optical fiber using wave division multiplexing, for example, where the first and second optical information are passed on different wavelengths (and respective receivers are tuned to receive only one of the wavelengths). No electrical connections are present in the optical cable 140. Because the optical cable 140 transmits optical signals as opposed to electrical signals, electrical resistance is not a factor. Therefore, the optical cable 140 is able to connect the sensor head 130 (and thus the probe tip 110) over significantly longer distances than conventional electrical cables used to connect probe tips, and to electrically isolate the DUT 170 from the test instrument 101.

In an embodiment, one or both of the optical power source 260 in the probe interface 150 and the optical signal source 210 in the sensor head 130 shuts down automatically when one or more optical fibers in the optical cable 140 become disconnected. This may be done by monitoring whether the photoreceiver 250 continues to receive optical signals from the optical signal source 210, and shutting down the optical power source 260 and/or the optical signal source 210 when the photoreceiver 250 stops receiving the optical signals.

Figure 3:
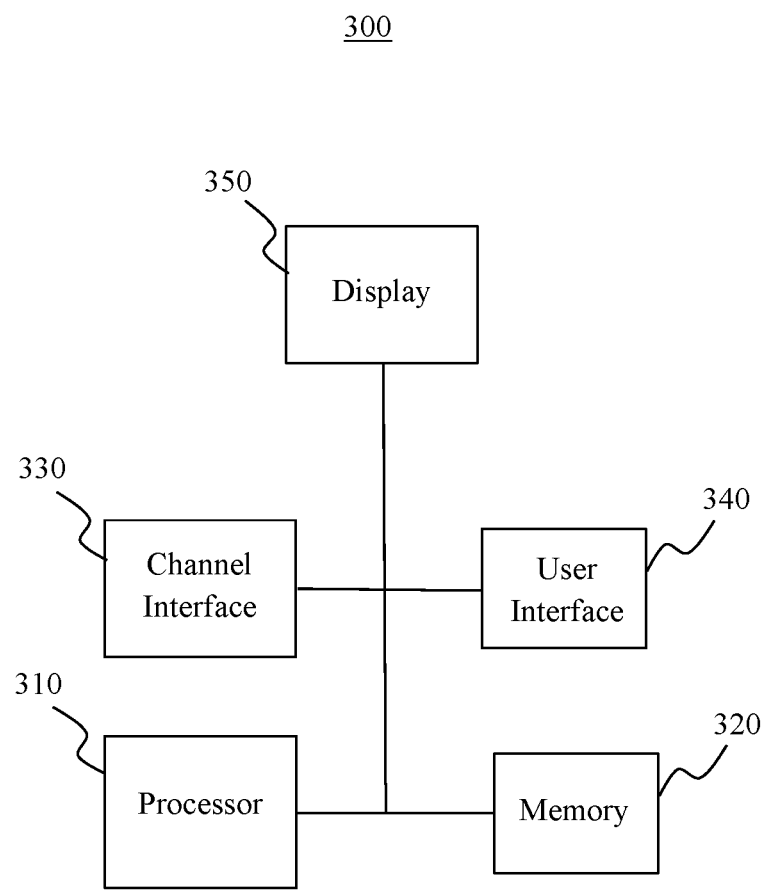
FIG. 3 is a simplified block diagram of the processing unit for the high voltage probe device, according to a representative embodiment.

FIG. 3 is a simplified block diagram of a processing unit, according to a representative embodiment. The description of the processing unit may apply to the processing unit 160 integrated with or connected to the test instrument 101, as well as to the first and second processing units 240 and 280 integrated with or connected to the sensor head 130 and the probe interface 150, respectively.

In the depicted embodiment, the processing unit 300 includes a processor 310, memory 320, a channel interface 330, a user interface 340, and a display 350. The processor 310, together with the memory 320, implements functionality of the test instrument 101, including processing and measuring test signals received from the DUT 170 via the probe device 105, and providing control signals, including calibration signals, to the probe device 105. For example, the memory 320 may store instructions, executable by the processing unit 300, for calibrating the probe device 105 in response to temperature changes, as discussed below.

Referring to FIG. 3, the processor 310 may include one or more computer processors, digital signal processors (DSPs), central processing units (CPUs), microprocessors, graphics processing units (GPUs), field-programmable gate arrays (FPGAs), application specific integrated circuits (ASICs), or combinations thereof, using any combination of hardware, software, firmware, hard-wired logic circuits, or combinations thereof. The processor 310 may include its own processing memory for storing computer readable code (e.g., software, software modules, software engines) that enables performance of the various functions described herein.

The memory 320, and any other memory described herein, may be various types of random access memory (RAM), read only memory (ROM) and/or other storage media, including flash memory, EPROM, EEPROM, compact disk read only memory (CD-ROM), digital versatile disk (DVD), registers, latches, flip-flops, a hard disk, a removable disk, tape, floppy disk, blu-ray disk, or USB driver, or any other form of storage medium known in the art, which are tangible and non-transitory (e.g., as compared to transitory propagating signals). Memories may be volatile or non-volatile, secure and/or encrypted, unsecure and/or unencrypted, without departing from the scope of the present teachings. The memory 320 is representative of one or more memories and databases, including the processing memory, as well as multiple memories and databases, including distributed and networked memories and databases.

The channel interface 330 interfaces the processor 310 and/or the memory 320 with the channels of the test instrument 101, including the one or more channels 115. The one or more channels 115, for example, may include a port configured to electrically and mechanically receive the probe interface 150. The one or more channels 115 may further include a coupler and an analog to digital converter (ADC) for receiving and digitizing the analog electrical test signals from the probe interface 150, as is known by one of ordinary skill in the art. The channel interface 330 provides the digitized electrical test signals to the processor 310, which performs additional processing. The channel interface 330 may also exchange the first and second electrical low frequency information between the processor 310 and the sensor head 130 and/or the probe interface 150, to the extent the processor 310 generates or processes the first and second electrical low frequency information.

The user interface 340 interfaces the processor 310 and/or the memory 320 with a user of the test instrument 101. The user interface 340 is configured to provide information and data output by the processor 310 and/or the memory 320 to the user, including measurement information of the test signals, and/or for receiving information and data input by the user. That is, the user interface 340 enables the user to enter data and to control aspects of the testing process of the DUT 170, and also enables the processor 310 to indicate the effects of the user's control. The user interface 340 may include any of various interface devices, such as a mouse, a keyboard, a mouse, a trackball, a joystick, a microphone, a video camera, a touchpad, a touchscreen, voice or gesture recognition captured by a microphone or video camera, for example.

The display 350 may be a monitor such as a computer monitor, a television, a liquid crystal display (LCD), an organic light emitting diode (OLED), a flat panel display, a solid-state display, or a cathode ray tube (CRT) display. The display 350 and/or the user interface 340 may include one or more display interface(s), in which case the display 350 may provide a graphical user interface (GUI) for displaying and receiving information to and from a user.

In an embodiment, the user interface 340 may include controllers (e.g., knobs) for controlling the displayed measurement information. The controllers respectively control (i) the current amplifier 212 of the optical signal source 210 in the sensor head 130, (ii) bias of the optical signal source 210 in the sensor head 130, (iii) the TIA 252 of the probe interface 150, (iv) bias of the photoreceiver 250 connected to the TIA 252 of the probe interface 150, and (v) offset of the test instrument 101. These five controllers may be used to perform recalibration of the probe device 105, discussed below.

Figure 4A:
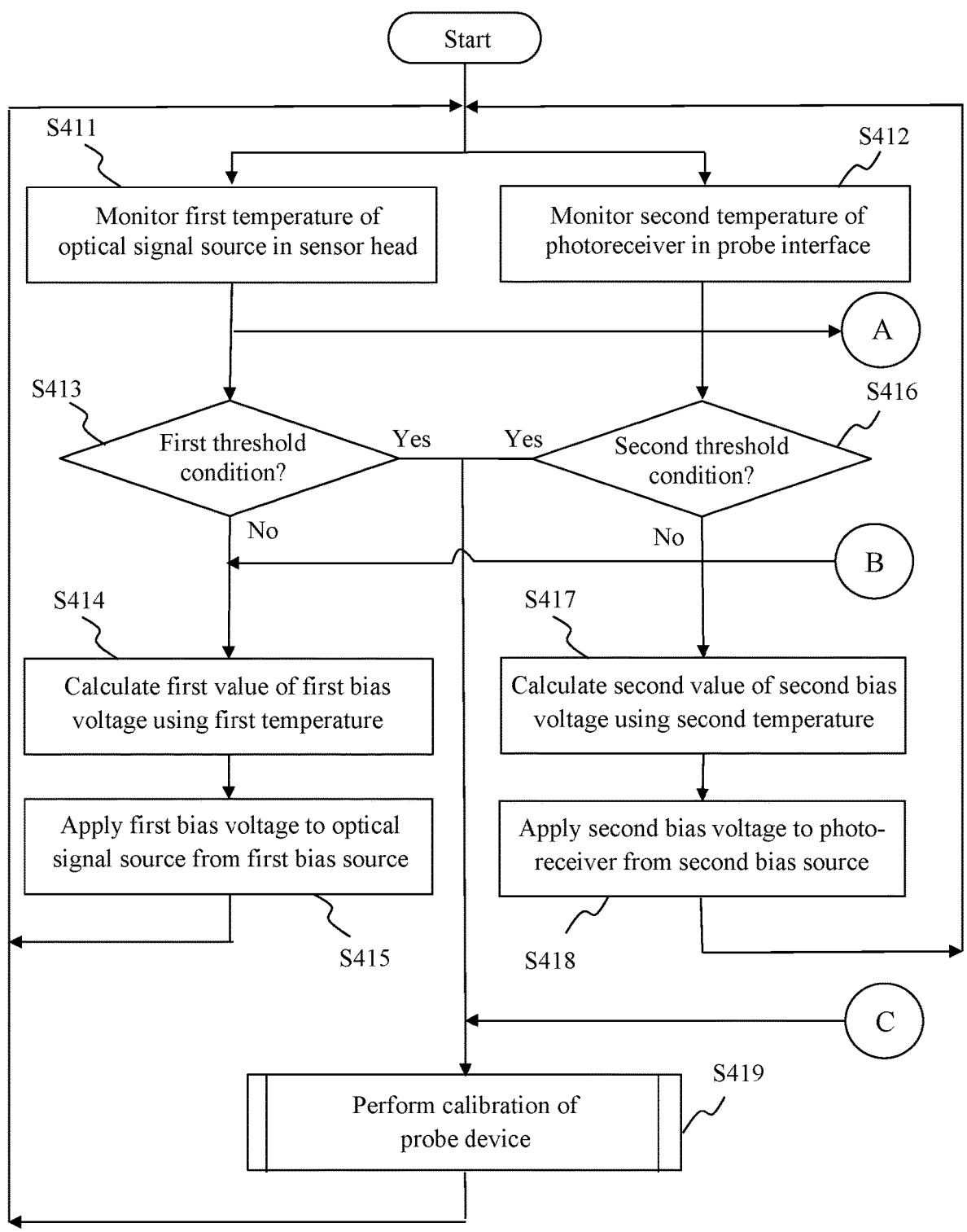
FIG. 4A is a flow diagram of method for compensating for thermal drift of a probe device performing high voltage measurements of a DUT, according to a representative embodiment.
Figure 4B:
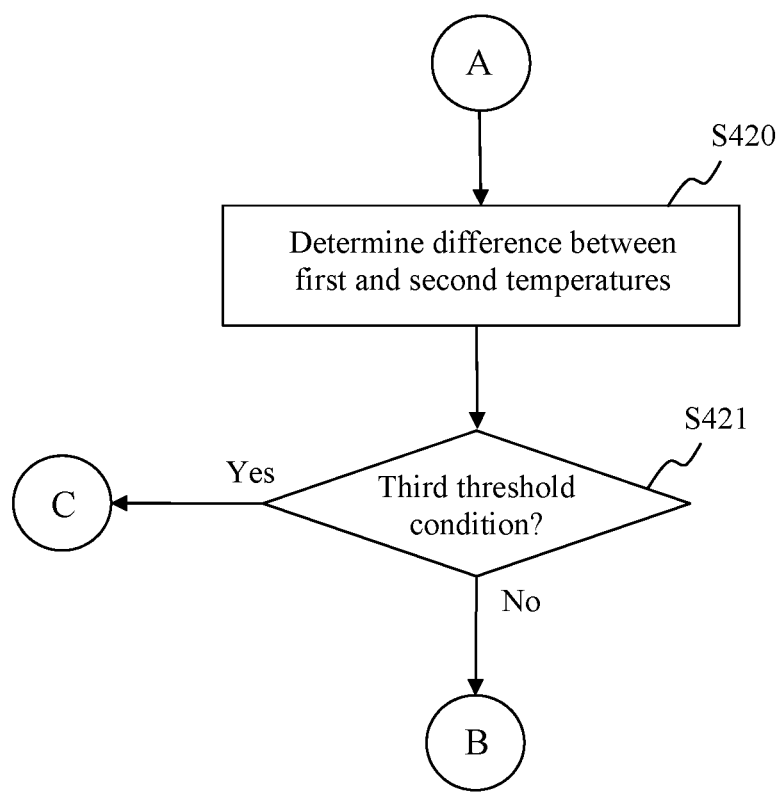
FIG. 4B is a continuation of the flow diagram of method for compensating for thermal drift of a probe device performing high voltage measurements of a DUT, according to a representative embodiment.

FIGS. 4A and 4B are a flow diagram of method for compensating for thermal drift of a probe device performing high voltage measurements of a DUT, according to a representative embodiment. The probe device includes a probe tip (e.g., probe tip 110) connected to the DUT, a sensor head (e.g., sensor head 130) connected to the probe tip, a probe interface (e.g., probe interface 150) connected to the sensor head via an optical cable (e.g., optical cable 140), and a test instrument (e.g., test instrument 101) for performing measurements of the DUT. The steps in FIGS. 4A and 4B may be implemented using a processing unit local to the sensor head (e.g., first processing unit 240), a processing unit local to the probe interface head (e.g., second processing unit 280), and/or a processing unit of the test instrument (e.g., processing unit 160).

Referring to FIG. 4A, a first temperature of an optical signal source (e.g., optical signal source 210) in the sensor head is monitored in block S411 during measurements of the DUT using the probe device. As discussed above, the optical signal source is configured to receive output electrical signals from the DUT via the probe tip during the measurements, and to convert the output electrical signals to optical signals. In particular, the output electrical signals drive the optical signal source to provide optical signals corresponding to the output electrical signals from the DUT. The first temperature may be monitored by a first temperature sensor (e.g., first temperature sensor 216) provided in the sensor head.

In block S412, a second temperature of the photoreceiver (e.g., photoreceiver 250) in the probe interface is also monitored during the DUT measurements. The photoreceiver is configured to convert the optical signals received from the optical signal source via the optical cable to electrical test signals, which are input to the test instrument. The second temperature may be monitored by a second temperature sensor (e.g., second temperature sensor 256) provided in the probe interface.

In block S413, it is optionally determined whether a first threshold condition exists in which the first temperature being monitored is outside a first predefined temperature range that has predefined upper and lower temperature values. When the first threshold condition does exist (block S413: Yes), it is determined that a recalibration of the optical signal source is to be performed according to a calibration process indicated by block S419, discussed below with reference to FIG. 5.

When the first threshold condition does not exist (block S413: No), meaning that the first temperature is within the predefined first temperature range, the process proceeds to calculate a first value of a first bias voltage using the first temperature in block S414, and to apply the first bias voltage at the first value to the optical signal source in block S415. The first value of the first bias voltage may be calculated by the local processing unit in the source head, for example, which provides the first value to a first bias source (e.g., first bias source 214). As discussed above, the first value may be calculated by applying a first curve fit polynomial to the first temperature, for example, where the first curve fit polynomial defines a first temperature drift profile of the optical signal source over the first predefined temperature range. The first bias source generates the first bias voltage at the first value, and applies the first bias voltage to the bias input of the optical signal source. The first bias voltage compensates for thermal drift of the optical signal source that may occur over the course of testing the DUT. The process returns to block S411 to continue the monitoring of the first temperature of the optical signal source.

Likewise, with regard to the probe interface, it is optionally determined in block S416, whether a second threshold condition exists in which the second temperature being monitored is outside a second predefined temperature range that has predefined upper and lower temperature values. When the second threshold condition does exist (block S416: Yes), it is determined that a recalibration of the photoreceiver is to be performed according to the calibration process indicated by block S419, discussed below with reference to FIG. 5.

When the second threshold condition does not exist (block S416: No), meaning that the second temperature is within the predefined second temperature range, the process proceeds to calculate a second value of a second bias voltage using the second temperature in block S417, and to apply the second bias voltage at the second value to the photoreceiver in block S418. The second value of the second bias voltage may be calculated by the local processing unit in the probe interface, for example, which provides the second value to a second bias source (e.g., second bias source 254). As discussed above, the second value may be calculated by applying a second curve fit polynomial to the second temperature, for example, where the second curve fit polynomial defines a second temperature drift profile of the photoreceiver over the second predefined temperature range. The second bias source generates the second bias voltage at the second value, and applies the second bias voltage to the bias input of the photoreceiver. The second bias voltage compensates for thermal drift of the photoreceiver that may occur over the course of testing the DUT. The process returns to block S412 to continue the monitoring of the second temperature of the photoreceiver.

FIG. 4B is directed to determining whether a third threshold condition exists, based on a difference between the first temperature and the second temperature exceeding a predefined difference threshold. In particular, the process enters FIG. 4B (at circle A), and at block S420, determines a difference between the first temperature monitored at block S411 and the second temperature monitored at block S412. In block S421, it is optionally determined whether a third threshold condition exists in which the difference (delta) between the first and second temperatures exceed a predefined difference threshold. The value of the difference threshold may be determined empirically, for example, based on the acceptable tolerance of the entire system. When the third threshold condition does exist (block S421: Yes), it is determined that a recalibration of both the optical signal source and the photoreceiver is to be performed and the process returns to FIG. 4A (at circle C) at block S419. When the third threshold condition does not exist (block S421: No), meaning that the difference between the first and second temperatures is within acceptable limits, it is determined that no recalibrations is required and the process returns to FIG. 4A (at circle B). The process continues to calculate and apply the first value of the first bias voltage to the optical signal source in blocks S414 and S415, and to calculate and apply the second value of the second bias voltage to the photoreceiver in blocks S417 and S418, as discussed above. In an alternative embodiment, the difference between the first and second temperatures is determined and compared to the predetermined difference threshold only after it has been determined that both of the first and second temperatures are within the first and second predefined temperature ranges, respectively.

Figure 5:
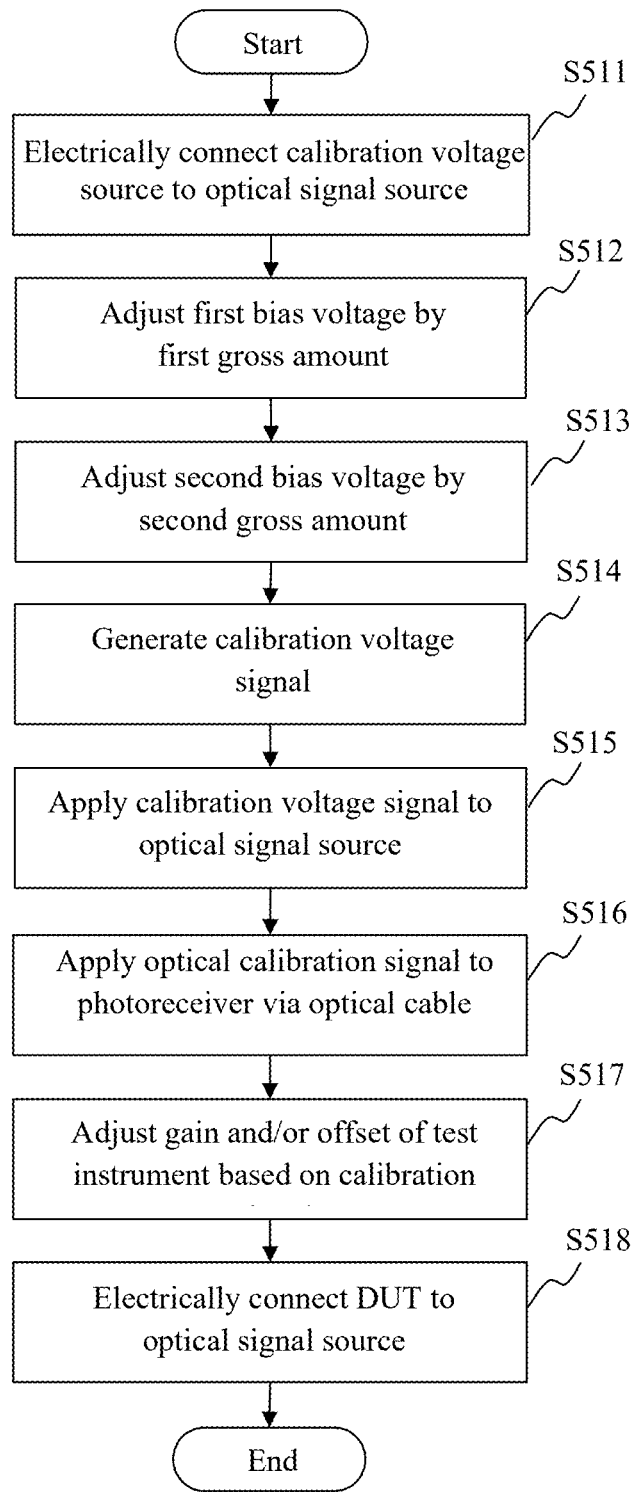
FIG. 5 is a flow diagram of a method for performing recalibration of a probe device having high common mode rejection ratio (CMRR), according to a representative embodiment.

FIG. 5 is a flow diagram of a method for performing recalibration of a probe device having high CMRR, according to a representative embodiment. The method of FIG. 5 may be triggered when the first and/or second temperatures measured at the source head and the probe interface are not within the first and second predetermined temperature ranges, respectively.

Referring to FIG. 5, the optical signal source of the sensor head is electrically disconnected from the DUT, and electrically connected to an internal calibration voltage source (e.g., calibration voltage source 245) in block S511. The calibration voltage source may be internal to the sensor head, and may be connected to the optical signal source by operation of a switch (e.g., switch 205). The switch may be operated automatically by the first processing unit and/or the test instrument, or manually by a user through a user interface of the test instrument or by physical manipulation of the switch.

In block S512, when it has been previously determined that the first threshold condition exists (e.g., in block S413) indicating that the first temperature is outside the first predefined temperature range, the first bias voltage of the optical signal source is adjusted by a first gross amount. Otherwise, block S512 is skipped. Likewise, in block S513, when it has been previously determined that the second threshold condition exists (e.g., in block S414) indicating that the second temperature is outside the second predefined temperature range, the second bias voltage of the photoreceiver is adjusted by a second gross amount. Otherwise, block S513 is skipped. Each of the first gross amount and the second gross amount of the first and second bias voltages may be previously determined empirically during development of the probe device, for example, based on a target tolerance. For example, the first and second gross amounts of the bias voltage adjustments may be retrieved from a look-up table based on the amounts the first and second temperatures are outside of the first and second predefined temperature ranges, respectively.

In block S514, a calibration voltage signal is generated by the calibration voltage source internal to the sensor head. The value of the calibration voltage is an arbitrary but known voltage, as would be apparent to one skilled in the art. In block S515, the calibration voltage signal is applied to the optical signal source through the switch. In particular, the calibration voltage signal is input to a current amplifier that drives the optical signal source to output an optical calibration signal corresponding to the calibration voltage signal. In block S516, the optical calibration signal is transmitted to the photoreceiver via the optical fiber cable, which outputs an electrical calibration signal to the test instrument in response.

In block S517, at least one of gain and offset of the test instrument is adjusted based on the electrical calibration signal in order to calibrate the probe device. Adjusting at least one of the gain and the offset of the test instrument may include combining actual gain of the sensor head and the probe interface and probe tip gain of the probe tip, and adjusting a display gain of a display of the test instrument to match the actual gain. The actual gain of the sensor head and the probe interface is measured from the current amplifier that drives the optical signal source in the sensor head, through the probe interface, to an input of the test instrument. The actual gain may be measured by the test instrument. The probe tip gain may be retrieved by the test instrument from a memory in a connector (e.g., connector 120) connecting the probe tip and the sensor head, discussed above. Notably, substantially the same process is followed to perform the initial calibration of the probe device before the start of testing the DUT.

After recalibration, the optical signal source of the sensor head is electrically disconnected from the calibration voltage source, and electrically connected to the DUT via the probe tip of the probe device in block S518. The connection to the DUT may be performed by automatic or manual operation of the switch, for example. Once the recalibration is complete, the process returns to blocks S411 and S412 of FIG. 4, where the first and second temperatures of the optical signal source and the photoreceiver are measures, while bias adjustments are made to the optical signal source and/or the photoreceiver as long as the first and second temperatures are within corresponding first and second predefined temperature ranges, respectively.

While the invention has been illustrated and described in detail in the drawings and foregoing description, such illustration and description are to be considered illustrative or exemplary and not restrictive; the invention is not limited to the disclosed embodiments.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is no to be restricted except within the scope of the appended claims.

The invention claimed is:

1. A probe device for performing voltage measurements by a test instrument of a device under test (DUT), the probe device comprising:
   an optical cable comprising a plurality of fibers;
   a sensor head connected to the optical cable, wherein the sensor head comprises:
   a laser source configured to receive output electrical signals from output by the DUT, the output electrical signals driving the laser source to provide optical signals corresponding to the output electrical signals from the DUT;
   a first temperature sensor configured to monitor a first temperature of the laser source;
   a first voltage source configured to provide a first bias voltage for the laser source; and
   a first processing unit configured to calculate a first value of the first bias voltage using the first temperature from the first temperature sensor, and to control the first voltage source to compensate for thermal drift of the laser source within a first predefined temperature range; and a probe interface connected at one end to the test instrument and connected at another end to the sensor head via the optical cable, wherein the probe interface comprises:

a photoreceiver configured to receive the optical signals over the optical cable, to convert the optical signals to electrical test signals and to input the electrical test signals to the test instrument;

a second temperature sensor configured to monitor a second temperature of the photoreceiver;

a second voltage source configured to provide a second bias voltage to the photoreceiver; and a second processing unit configured to calculate a second value of the second bias voltage using the second temperature from the second temperature sensor, and to control the second voltage source to compensate for thermal drift of the photoreceiver within a second predefined temperature range.

2. The probe device of claim 1, further comprising at least one probe tip connected to the sensor head and configured to interface with the DUT to provide the output electrical signals from the DUT to the sensor head.

3. The probe device of claim 2, wherein the probe interface further comprises a power laser configured to convert electrical energy from the test instrument to optical energy, and to transmit the optical energy over a fourth fiber of the optical cable; and wherein the sensor head further comprises an optical power converter (OPC) configured to receive the optical energy from the power laser and to convert the optical energy to electrical power for the sensor head.

4. The probe device of claim 1, wherein the test instrument or the first processing unit is configured to determine whether a first threshold condition exists based on the first temperature being outside the first predefined temperature range, and wherein the test instrument or the second processing unit is configured to determine whether a second threshold condition exists based on the second temperature being outside the second predefined temperature range.

5. The probe device of claim 4, wherein, when the first threshold condition exists, the first processing unit adjusts the first bias voltage of the laser source by a first gross amount with the sensor head electrically disconnected from the DUT, and when the second threshold condition exists, the second processing unit adjusts the second bias voltage of the photoreceiver by a second gross amount with the sensor head electrically disconnected from the DUT.

6. The probe device of claim 5, wherein, when the first threshold condition and/or the second threshold condition exists:

the first processing unit controls a calibration voltage source internal to the sensor head to generate a calibration voltage signal to apply to the laser source, the laser source providing an optical calibration signal to the photoreceiver to provide an electrical calibration signal; and the test instrument adjusts at least one of gain and offset of the test instrument based on the electrical calibration signal.

7. The probe device of claim 6,
wherein the sensor head further comprises a first light emitting diode (LED) and a first sensor diode, wherein the probe interface further comprises a second LED and a second sensor diode, wherein the first LED is configured to convert first electrical low frequency information to first optical information and to transmit the first optical information over a second fiber of the optical cable, and the second LED is configured to convert second electrical low frequency information to second optical information and to transmit the second optical information over a third fiber of the optical cable, and wherein the first sensor diode is configured to receive the second optical information over the optical cable and to convert the second optical information into second electrical low frequency information, and the second sensor diode is configured to receive the first optical information over the optical cable and to convert the first optical information into first electrical low frequency information.

8. The probe device of claim 7, wherein the test instrument controls the first processing unit, the second processing unit, and the calibration voltage source internal to the sensor head using the first and second electrical low frequency information.

9. The probe device of claim 4, wherein the test instrument is further configured to determine whether a third threshold condition exists based on a difference between the first temperature and the second temperature exceeding a predefined difference threshold, and wherein, when the third threshold condition exists, the first processing unit adjusts the first bias voltage of the laser source by a first gross amount with the sensor head electrically disconnected from the DUT; the second processing unit adjusts the second bias voltage of the photoreceiver by a second gross amount with the sensor head electrically disconnected from the DUT; the first processing unit controls a calibration voltage source internal to the sensor head to generate a calibration voltage signal to apply to the laser source, the laser source providing an optical calibration signal to the photoreceiver to provide an electrical calibration signal; and the test instrument adjusts at least one of gain and offset of the test instrument based on the electrical calibration signal.

10. The probe device of claim 6, wherein the calibration voltage source comprises a digital to analog converter (DAC).

11. The probe device of claim 1, wherein each of the first voltage source and the second voltage source comprises a linear regulator.

12. A method of compensating for thermal drift of a probe device performing measurements of a device under test (DUT), wherein the probe device comprises a probe interface connected to a test instrument, a sensor head connected to the probe interface via an optical cable, and a probe tip connected to the sensor head, the method comprising:

monitoring a first temperature of a laser source in the sensor head, wherein the laser source is configured to receive output electrical signals from the DUT via the probe tip, wherein the output electrical signals drive the laser source to provide optical signals corresponding to the output electrical signals output by the DUT;

monitoring a second temperature of a photoreceiver in the probe interface, wherein the photoreceiver is configured to convert the optical signals received from the laser source in the sensor head via the optical cable to electrical test signals to input to the test instrument;

calculating a first value of a first bias voltage for the laser source using the first temperature from a first temperature sensor;

applying the first value of the first bias voltage to the laser source using a first bias source to compensate for thermal drift of the laser source when the first temperature is within a first predefined temperature range;

calculating a second value of a second bias voltage for the photoreceiver using the second temperature from a second temperature sensor, and applying the second value of the second bias voltage to the photoreceiver to using a second bias source to compensate for thermal drift of the photoreceiver when the second temperature is within a second predefined temperature range.

13. The method of claim 12, wherein calculating the first value of the first bias voltage of the laser source comprises applying a first curve fit polynomial to the first temperature, wherein the first curve fit polynomial defines a first temperature drift profile of the laser source over the first predefined temperature range, and wherein calculating the second value of the second bias voltage of the photoreceiver comprises applying a second curve fit polynomial to the second temperature, wherein the second curve fit polynomial defines a second temperature drift profile of the photoreceiver over the second predefined temperature range.

14. The method of claim 12, further comprising:

determining whether a first threshold condition exists during the measurements of the DUT based on the first temperature being monitored, wherein the first threshold condition indicates that the first temperature is outside the first predefined temperature range;

determining whether a second threshold condition exists during the measurements of the DUT based on the second temperature being monitored, wherein the second threshold condition indicates that the second temperature is outside the second predefined temperature range;

when the first threshold condition exists, adjusting the first bias voltage of the laser source by a first gross amount with the sensor head electrically disconnected from the DUT; and when the second threshold condition exists, adjusting the second bias voltage of the photoreceiver by a second gross amount with the sensor head electrically disconnected from the DUT.

15. The method of claim 14, wherein, when the first threshold condition and/or the second threshold condition exists, the method further comprises:

electrically connecting the laser source to a calibration voltage source for generating a calibration voltage signal;

applying the calibration voltage signal to the laser source, wherein the laser source outputs an optical calibration signal to the photoreceiver via the optical cable in response, and wherein the photoreceiver outputs an electrical calibration signal in response to the optical calibration signal; and adjusting at least one of gain and offset of the test instrument based on the electrical calibration signal.

16. The method of claim 15, wherein adjusting at least one of the gain and the offset of the test instrument based on the electrical calibration signal comprises combining actual gain of the sensor head and the probe interface and probe tip gain of the probe tip, and adjusting a display gain of the test instrument to match the actual gain, and wherein the actual gain is measured from an amplifier that drives the laser source in the sensor head to an input of the test instrument, and the probe tip gain is retrieved from a memory device in a connector connecting the probe tip and the sensor head.

17. The method of claim 12, further comprising:

monitoring a third temperature of a power laser in the probe interface, wherein the power laser is configured to generate optical energy in response to electrical energy received from the test instrument;

monitoring a fourth temperature of an optical power converter (OPC) in the sensor head, wherein the OPC is configured to convert the optical energy to electrical power for powering the sensor head;

adjusting a third bias voltage of the power laser based on the third temperature; and adjusting an output power of the optical energy generated by the power laser in response to the fourth temperature.

18. A system for performing voltage measurements by a test instrument of a device under test (DUT), the system comprising:

a probe device connected to the test instrument, ¢he— wherein the probe device comprises:

an optical cable comprising a plurality of fibers;

a sensor head connected to the optical cable, wherein the sensor head comprises:

a laser source configured to receive output electrical signals from output by the DUT, the output electrical signals driving the laser source to provide optical signals corresponding to the output electrical signals from the DUT;

a first temperature sensor configured to monitor a first temperature of the laser source; and a first voltage source configured to provide a first bias voltage for the laser source; and a probe interface connected at one end to the test instrument and connected at another end to the sensor head via the optical cable, wherein the probe interface comprises:

a photoreceiver configured to receive the optical signals over the optical cable, to convert the optical signals to electrical test signals and to input the electrical test signals to the test instrument;

a second temperature sensor configured to monitor a second temperature of the photoreceiver; and a second voltage source configured to provide a second bias voltage to the photoreceiver;

a first processing unit configured to calculate a first value of the first bias voltage using the first temperature from the first temperature sensor, and to control the first voltage source to compensate for thermal drift of the laser source within a first predefined temperature range; and a second processing unit configured to calculate a second value of the second bias voltage using the second temperature from the second temperature sensor, and to control the second voltage source to compensate for thermal drift of the photoreceiver within a second predefined temperature range.

19. The system of claim 18, wherein the first processing unit is in the sensor head, and the second processing unit is in the probe interface.

20. The system of claim 18, wherein at least one of the first processing unit or the second processing unit is in the test instrument.

* * * * *

UNITED STATES PATENT AND TRADEMARK OFFICE
CERTIFICATE OF CORRECTION

| | |
|---|---|
| PATENT NO. | : 12,372,551 B2 |
| APPLICATION NO. | : 17/972297 |
| DATED | : July 29, 2025 |
| INVENTOR(S) | : Hal Robert Paver et al. |

Page 1 of 1

It is certified that error appears in the above-identified patent and that said Letters Patent is hereby corrected as shown below:

On the Title Page

Item (56), in Column 2, under "Other Publications", Line 1, delete "English translation of CN203502480U, 7 pgs.".

In the Claims

In Column 16, Line 57, in Claim 1, after "signals" delete "from".

Signed and Sealed this
Fourteenth Day of October, 2025

John A. Squires
*Director of the United States Patent and Trademark Office*